United States Patent
Zhang et al.

(10) Patent No.: US 12,433,116 B2
(45) Date of Patent: Sep. 30, 2025

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Bo Zhang, Beijing (CN); Rong Wang, Beijing (CN); Zhiwen Chu, Beijing (CN); Donghui Tian, Beijing (CN); Qian Ma, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 76 days.

(21) Appl. No.: 17/781,718

(22) PCT Filed: Jul. 19, 2021

(86) PCT No.: PCT/CN2021/106987
§ 371 (c)(1),
(2) Date: Jan. 26, 2023

(87) PCT Pub. No.: WO2023/000122
PCT Pub. Date: Jan. 26, 2023

(65) Prior Publication Data
US 2024/0188353 A1   Jun. 6, 2024

(51) Int. Cl.
*H10K 59/131*   (2023.01)
*G06F 3/041*   (2006.01)
(Continued)

(52) U.S. Cl.
CPC ......... *H10K 59/131* (2023.02); *G06F 3/0412* (2013.01); *G09G 3/006* (2013.01); *H10K 59/122* (2023.02); *G09G 2330/12* (2013.01)

(58) Field of Classification Search
CPC .. H10K 59/131; H10K 59/122; G06F 3/0412; G09G 3/006
See application file for complete search history.

(56) References Cited

U.S. PATENT DOCUMENTS 11,120,714 B2 *   9/2021   Lee .................. G02F 1/136259
2014/0176844 A1   6/2014   Yanagisawa
(Continued)

FOREIGN PATENT DOCUMENTS

CN   108154800 A   6/2018
CN   108226759 A   6/2018
(Continued)

*Primary Examiner* — Michael Jung
(74) *Attorney, Agent, or Firm* — Ling Wang; Stephen Yang; Ling and Yang Intellectual Property

(57) ABSTRACT

Disclosed is a display substrate including a display region and a peripheral region, the peripheral region includes a bending region located on one side of the display region and further includes a first crack detection line including a first lead segment, a second lead segment, a third lead segment, and a fourth lead segment, the first and fourth lead segments are at least partially located in the bending region, the second and third lead segments at least partially surround the display region. The display substrate further includes a pixel definition layer having a first boundary on a side of a first via away from the display region and a touch insulation layer having a second boundary on the side of the first via away from the display region, and the second boundary is located on a side of the first boundary away from the display region.

20 Claims, 11 Drawing Sheets

(51) Int. Cl.
  *G09G 3/00* (2006.01)
  *H10K 59/122* (2023.01)

(56) References Cited

U.S. PATENT DOCUMENTS

| | | |
|---|---|---|
| 2014/0368228 A1 | 12/2014 | Kim |
| 2016/0322451 A1 | 11/2016 | Park |
| 2017/0358641 A1* | 12/2017 | Park .................... G09G 3/3233 |
| 2018/0158741 A1 | 6/2018 | Kim et al. |
| 2019/0157607 A1 | 5/2019 | Kim et al. |
| 2019/0165076 A1* | 5/2019 | Lee .................... H10K 59/131 |
| 2020/0025820 A1 | 1/2020 | Zhao et al. |
| 2020/0152708 A1* | 5/2020 | Kim .................... G06F 3/0446 |
| 2020/0235169 A1* | 7/2020 | Miyamoto ............ H05B 33/10 |
| 2021/0343748 A1 | 11/2021 | Liao et al. |
| 2022/0254285 A1 | 8/2022 | Wang et al. |
| 2023/0118675 A1* | 4/2023 | Kim .................... H10D 86/441 |
| | | 345/174 |

FOREIGN PATENT DOCUMENTS

| | | | |
|---|---|---|---|
| CN | 108649037 | A | 10/2018 |
| CN | 108831362 | A | 11/2018 |
| CN | 108922462 | A | 11/2018 |
| CN | 109697947 | A | 4/2019 |
| CN | 109830502 | A | 5/2019 |
| CN | 111509026 | A | 8/2020 |
| IN | 111540294 | A | 8/2020 |
| KR | 10-2016-0129156 | A | 11/2016 |

\* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2021/106987 having an international filing date of Jul. 19, 2021. The entire contents of the above-identified application are hereby incorporated by reference.

TECHNICAL FIELD

Embodiments of the present disclosure relate to, but are not limited to, the field of display technologies, in particular to a display substrate and a display apparatus.

BACKGROUND

An Organic Light Emitting Diode (OLED) is an active light emitting display device, which has advantages of auto-luminescence, a wide viewing angle, a high contrast ratio, low power consumption, an extremely high response speed, lightness and thinness, bendability, a low cost, etc. With constant development of display technologies, a flexible display apparatus (Flexible Display) using an OLED as a light emitting device and performing signal control by use of a Thin Film Transistor (TFT for short) has become a mainstream product in the field of display at present.

SUMMARY

The following is a summary of subject matters described herein in detail. This summary is not intended to limit the scope of protection of claims.

The present disclosure provides a display substrate, including a display region and a peripheral region located at a periphery of the display region, wherein the peripheral region includes a bending region located on one side of the display region; and a first crack detection line located in the peripheral region and at least partially surrounds that display region, wherein the first crack detection line includes a first lead segment, a second lead segment, a third lead segment, and a fourth lead segment, the first lead segment and the fourth lead segment are at least partially located in the bending region, the second lead segment and the third lead segment at least partially surround the display region, one end of the first lead segment is connected with one end of the second lead segment through a first via, the other end of the second lead segment is connected with one end of the third lead segment through a second via, and the other end of the third lead segment is connected with one end of the fourth lead segment; the display substrate includes a base substrate, a drive circuit layer located on the base substrate, a pixel definition layer and a light emitting structure layer which are located on a side of the drive circuit layer away from the base substrate, a touch structure layer located on a side of the pixel definition layer and the light emitting structure layer away from the base substrate, the pixel definition layer has a plurality of first openings in the display region, the plurality of first openings are configured to accommodate the light emitting structure layer; the touch structure layer includes a touch dielectric layer and a touch electrode layer located on a side of the touch dielectric layer away from the pixel definition layer; the pixel definition layer has a first boundary on a side of the first via away from the display region, and the touch dielectric layer has a second boundary on the side of the first via away from the display region, and the second boundary is located on a side of the first boundary away from the display region; and the pixel definition layer has a second opening in the peripheral region, and an orthographic projection of the first via on the base substrate is located in an orthographic projection of the second opening on the base substrate.

In an exemplary implementation mode, a shortest distance between the first boundary and the second boundary is greater than 20 microns.

In an exemplary implementation mode, the display substrate further includes a first planarization layer located between the drive circuit layer and the pixel definition layer, the first planarization layer has a third boundary on a side away from the first via, and the second boundary is located on a side of the third boundary away from the display region.

In an exemplary implementation mode, a shortest distance between the second boundary and the third boundary is greater than 20 microns.

In an exemplary implementation mode, a shortest distance between the first via and the second boundary and a shortest distance between the second via and the second boundary is equal.

In an exemplary implementation mode, the display substrate further includes a third via located on a side of the first via close to the display region, the third via electrically connects the second lead segment and the third lead segment.

In an exemplary implementation mode, an orthographic projection of the second via on the base substrate is located in the orthographic projection of the second opening on the base substrate.

In an exemplary implementation mode, the touch dielectric layer covers the third via and at least part of the third lead segment.

In an exemplary implementation mode, the second boundary is located in the bending region and the third boundary is located on a side of the first boundary close to the display region.

In an exemplary implementation mode, the display substrate further includes a plurality of pads located on a side of the bending region away from the display region; the display substrate further includes a test circuit, which is located between the bending region and the plurality of pads, and the other end of the first lead segment is electrically connected with the test circuit.

In an exemplary implementation mode, the test circuit includes a plurality of test units, at least one of the plurality of test units includes a first transistor and a second transistor, control terminals of the first transistor and the second transistor are connected with a test control line, first ends of the first transistor and the second transistor are configured to be electrically connected with a data line, a second end of the first transistor is configured to be electrically connected with the first crack detection line, and a second end of the second transistor is configured to be electrically connected with a detection data line.

In an exemplary implementation mode, the other end of the fourth lead segment is electrically connected with at least one of the plurality of pads.

In an exemplary implementation mode, the display region includes a first edge, a second edge, a third edge, and a fourth edge connected in sequence, and the first via is located in the peripheral region close to the first edge.

In an exemplary implementation mode, the second lead segment is located in the peripheral region close to the first edge, the second edge, the third edge, and the fourth edge; the third lead segment is located in the peripheral region close to the first edge, the second edge, the third edge, and the fourth edge; the display region includes a camera hole and the third lead segment is wound around the camera hole.

In an exemplary implementation mode, the display substrate further includes a second crack detection line which is located in the peripheral region and at least partially surrounds the display region, the second crack detection line includes a first end and a second end, and the first end and the second end are connected with at least one of the plurality of pads respectively.

In an exemplary implementation mode, the second crack detection line is left-right symmetrical with respect to a center line of the display region.

In an exemplary implementation mode, the first crack detection line includes a first sub-line and a second sub-line, and the second crack detection line includes a third sub-line and a fourth sub-line, wherein the first sub-line is located in the peripheral region close to the third edge and the fourth edge, and the second sub-line is located in the peripheral region close to the second edge and the third edge; the third sub-line is located in the peripheral region close to the third edge and the fourth edge, and the fourth sub-line is located in the peripheral region close to the second edge and the third edge.

In an exemplary implementation mode, the first via includes two vias, the second via includes two vias, the two first vias are left-right symmetrical with respect to a center line of the display region, and the two second vias are left-right symmetrical with respect to the centerline of the display region.

In an exemplary implementation mode, the first via and the second via are located between the display region and the bending region.

In an exemplary implementation mode, the drive circuit layer includes an active layer, a first gate metal layer, a second gate metal layer, a first source drain metal layer, and a second source drain metal layer which are sequentially stacked on the base substrate, the first lead segment, the second lead segment, and the fourth lead segment are disposed in a same layer as any one or more of the first gate metal layer, the second gate metal layer, the first source drain metal layer, and the second source drain metal layer; and the third lead segment is disposed in a same layer as the touch electrode layer.

The present disclosure also provides a display apparatus including the display substrate of any one of the foregoing.

Other aspects will become apparent upon reading and understanding of drawings and detailed description.

BRIEF DESCRIPTION OF DRAWINGS

The drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of various components in the drawings do not reflect actual scales and are only intended to illustrate contents of the present disclosure.

DETAILED DESCRIPTION

Figure 1:
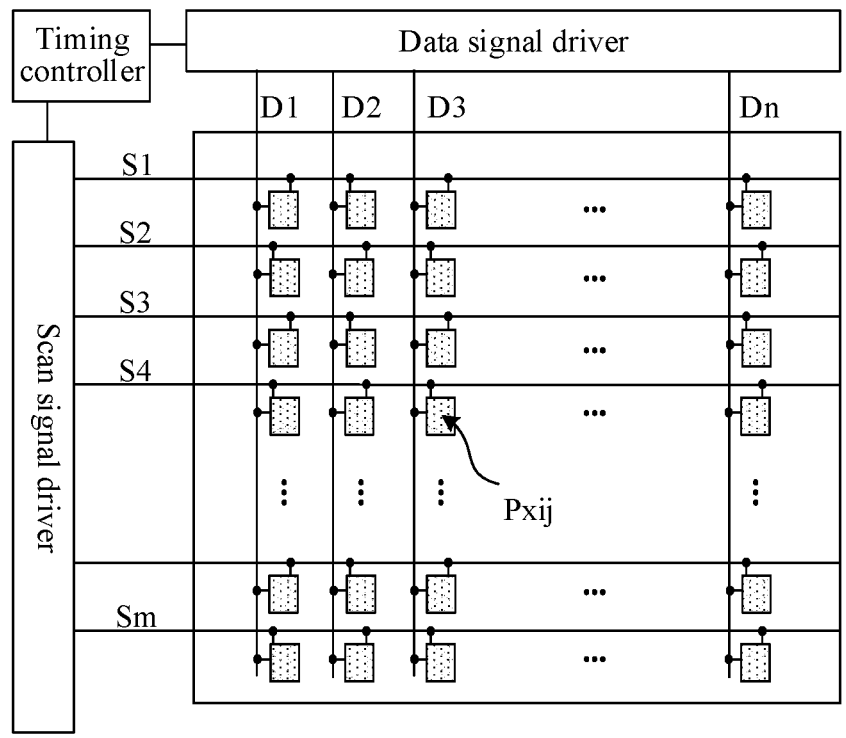
FIG. 1 is a schematic diagram of a structure of a display substrate.

To make objectives, technical solutions, and advantages of the present disclosure clearer, the embodiments of the present disclosure will be described in detail with reference to the drawings. It is to be noted that implementation modes may be implemented in multiple different forms. Those of ordinary skill in the art may easily understand such a fact that modes and contents may be transformed into various forms without departing from the spirit and scope of the present disclosure. Therefore, the present disclosure should not be interpreted as being limited to contents recorded in following implementation modes only. The embodiments in the present disclosure and features in the embodiments may be arbitrarily combined with each other without conflicts.

Sometimes for clarity, a size of each constituent element, a thickness of a layer, or a region in the drawings may be exaggerated. Therefore, one mode of the present disclosure is not necessarily limited to the size, and shapes and sizes of various components in the drawings do not reflect actual scales. In addition, the drawings schematically illustrate ideal examples, and one mode of the present disclosure is not limited to the shapes, numerical values, or the like shown in the drawings.

Ordinal numerals such as "first", "second", and "third" in the specification are set to avoid confusion of constituent elements, but are not intended to limit in terms of quantity.

In the specification, for convenience, wordings indicating directional or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements change appropriately according to a direction in which various constituent elements are described. Therefore, description is not limited to the wordings used in the specification, and appropriate substitutions may be made according to situations.

In the specification, unless otherwise specified and defined explicitly, terms "mount", "mutually connect", and "connect" should be understood in a broad sense. For example, a connection may be a fixed connection, a detachable connection, or an integrated connection; it may be a mechanical connection or an electrical connection; it may be a direct connection, an indirect connection through middleware, or communication inside two elements. Those of ordinary skill in the art may understand specific meanings of these terms in the present disclosure according to specific situations.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region that the current mainly flows through.

In the specification, a first electrode may be the drain electrode, and a second electrode may be the source electrode. Or, a first electrode may be the source electrode, and a second electrode may be the drain electrode. In a case that transistors with opposite polarities are used or that a direction of a current is changed during circuit operation, functions of the "source electrode" and the "drain electrode" may sometimes be exchanged. Therefore, the "source electrode" and the "drain electrode" may be exchanged in the specification.

In the specification, an "electrical connection" includes a case that constituent elements are connected together through an element having some electrical function. The "element having some electrical function" is not particularly limited as long as it allows sending and receiving of electric signals between the connected constituent elements. Examples of the "element having some electrical function" include not only an electrode and a wiring, but also a switching element such as a transistor, a resistor, an inductor, a capacitor, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is 80° or more and 100° or less, and thus also includes a state in which the angle is 850 or more and 950 or less.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed.

FIG. 1 is a schematic diagram of a structure of a display apparatus. Referring to FIG. 1, an OLED display apparatus may include a timing controller, a data driver, a scan driver, and a pixel array. The pixel array may include a plurality of scan signal lines (S1 to Sm), a plurality of data signal lines (D1 to Dn), and a plurality of sub-pixels Pxij. In an exemplary implementation mode, the timing controller may provide a control signal and a gray scale value suitable for specification of the data driver to the data driver, and may provide a scan start signal, a clock signal, and the like suitable for specification of the scan driver to the scan driver. The data driver may generate a data voltage to be provided to the data signal lines D1, D2, D3, . . . , and Dn using the gray scale value and the control signal received from the timing controller. For example, the data driver may sample the gray scale value using the clock signal, and apply a data voltage corresponding to the gray scale value to the data signal lines D1 to Dn in a unit of a sub-pixel row, wherein n may be a natural number. The scan driver may generate a scan signal to be provided to the scan signal lines S1, S2, S3, . . . , and Sm by receiving the clock signal, the scan start signal, etc., from the timing controller. For example, the scan driver may provide sequentially a scan signal with an on-level pulse to the scan signal lines S1 to Sm. For example, the scan driver may be constructed to be in a form of a shift register and may generate a scan signal in a manner of transmitting sequentially the scan start signal provided in a form of an on-level pulse to a next-stage circuit under control of the clock signal, wherein m may be a natural number. A sub-pixel array may include a plurality of sub-pixels Pxij. Each sub-pixel Pxij may be connected with a corresponding data signal line and a corresponding scan signal line, wherein i and j may be natural numbers. A sub-pixel Pxij may refer to a sub-pixel in which a transistor is connected with an i-th scan signal line and connected with a j-th data signal line.

Figure 2:
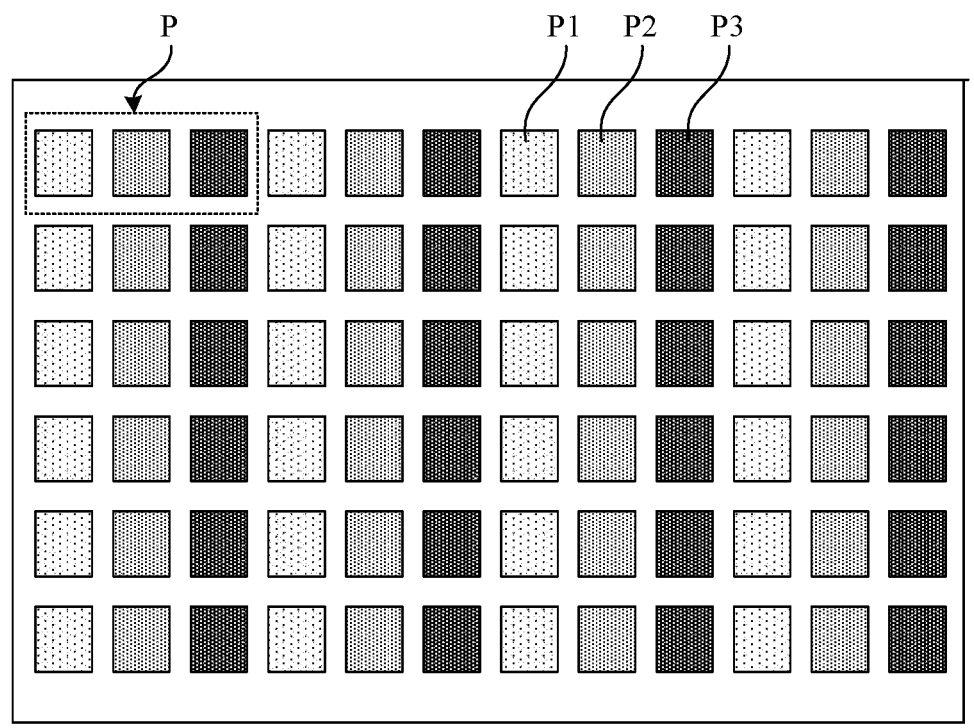
FIG. 2 is a schematic diagram of a pixel arrangement structure of a display substrate.

FIG. 2 is a schematic diagram of a planar structure of a display substrate. As shown in FIG. 2, the display substrate may include multiple pixel units P arranged in a matrix, at least one of the multiple pixel units P includes a first light emitting unit (sub-pixel) P1 that emits light of a first color, a second light emitting unit P2 that emits light of a second color, and a third light emitting unit P3 that emits light of a third color, the first light emitting unit P1, the second light emitting unit P2, and the third light emitting unit P3 each include a pixel drive circuit and a light emitting device. Pixel drive circuits in the first light emitting unit P1, the second light emitting unit P2, and the third light emitting unit P3 are respectively connected with a scan signal line, a data signal line, and a light emitting signal line. A pixel drive circuit is configured to receive a data voltage transmitted by a data signal line and output a corresponding current to a light emitting device under control of a scan signal line and a light emitting signal line. Light emitting devices in the first light emitting unit P1, the second light emitting unit P2, and the third light emitting unit P3 are respectively connected with pixel drive circuits of light emitting units where the light emitting devices are located, and a light emitting device is configured to emit light of corresponding brightness in response to a current output by a pixel drive circuit of a light emitting unit where the light emitting device is located.

In an exemplary implementation mode, a pixel unit P may include a red (R) light emitting unit, a green (G) light emitting unit, and a blue (B) light emitting unit, or may include a red light emitting unit, a green light emitting unit, a blue light emitting unit, and a white light emitting unit, which is not limited in the present disclosure. In an exemplary implementation mode, a shape of a light emitting unit in a pixel unit may be a rectangle, a rhombus, a pentagon, or a hexagon. When the pixel unit includes three light emitting units, the three light emitting units may be arranged in a manner to stand side by side horizontally, in a manner to stand side by side vertically, or in a manner like a Chinese character "品". When the pixel unit includes four light emitting units, the four light emitting units may be arranged in a manner to stand side by side horizontally, in a manner to stand side by side vertically, or in a manner to form a Square, which is not limited in the present disclosure.

Figure 3:
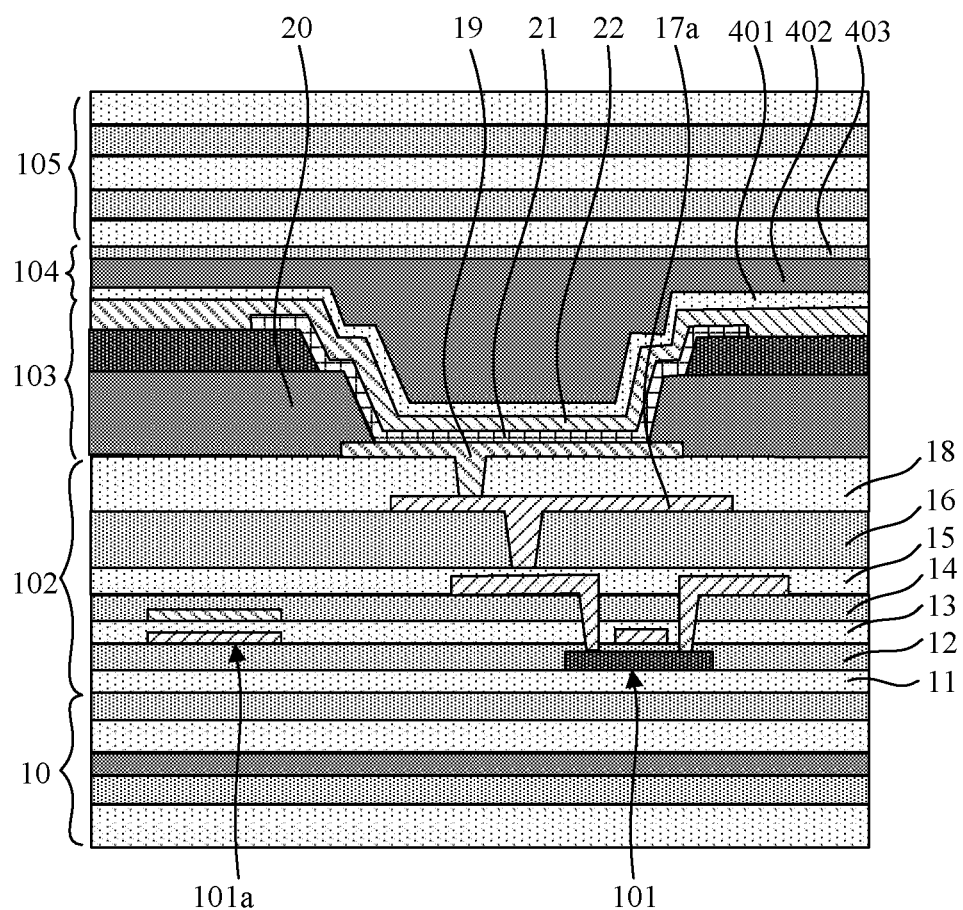
FIG. 3 is a schematic diagram of a sectional structure of a display substrate.

FIG. 3 is a schematic diagram of a sectional structure of a display substrate, illustrating a structure of a sub-pixel. As shown in FIG. 3, on a plane perpendicular to the display substrate, the display substrate may include a base substrate 10, a drive circuit layer 102 disposed on the base substrate 10, a light emitting structure layer 103 disposed on a side of the drive circuit layer 102 away from the base substrate 10, and an encapsulation layer 104 disposed on a side of the light emitting structure layer 103 away from the base substrate 10. In some possible implementation modes, the display substrate may include another film layer, such as a touch structure layer 105 disposed on the encapsulation layer 104, which is not limited in the present disclosure.

In an exemplary implementation mode, the base substrate 10 may be a flexible base substrate or a rigid base substrate. In an exemplary implementation mode, the flexible base substrate may include a first flexible material layer, a first inorganic material layer, a semiconductor layer, a second flexible material layer, and a second inorganic material layer which are stacked. Materials of the first and second flexible material layers may be Polyimide (PI), Polyethylene Terephthalate (PET), or a polymer soft film subjected to a surface treatment, etc., materials of the first and second inorganic material layers may be Silicon Nitride (SiNx), Silicon Oxide (SiOx), or the like, so as to improve a water-oxygen resistance capability of the base substrate, the first and second inorganic material layers are also referred to as barrier layers, a material of the semiconductor layer may be amorphous silicon (a-si). The drive circuit layer 102 may include multiple transistors and storage capacitors constituting a pixel drive circuit. In FIG. 3, illustration is made by taking each sub-pixel including one transistor 101 and one storage capacitor 101a as an example. The light emitting structure layer 103 may include an anode 19, a Pixel Definition Layer (PDL) 20, an organic emitting layer 21, and a cathode 22, the anode 19 is connected with a first connection electrode 17a through a via, the first connection electrode 17a is connected with a drain electrode of the transistor 101 through a via, the organic emitting layer 21 is connected with the anode 19, the cathode 22 is connected with the organic emitting layer 21, the organic emitting layer 21 emits light of a corresponding color under driving of the anode 19 and the cathode 22. The encapsulation layer 104 may include a first encapsulation layer 401, a second encapsulation layer 402, and a third encapsulation layer 403 that are stacked, wherein the first encapsulation layer 401 and the third encapsulation layer 403 may be made of an inorganic material, the second encapsulation layer 402 may be made of an organic material, and the second encapsulation layer 402 is arranged between the first encapsulation layer 401 and the third encapsulation layer 403, which may ensure that external water vapor cannot enter the light emitting structure layer 103.

In an exemplary implementation mode, the touch structure layer 105 may include a buffer layer, a first touch electrode layer (i.e., a bridging layer), a touch dielectric layer, a second touch electrode layer, and a protective layer that are stacked on the encapsulation layer 104, a plurality of first touch electrodes, a plurality of second touch electrodes, and a plurality of first connection parts may be arranged on a same layer and on the second touch electrode layer, and may be formed through a same patterning process, and the first touch electrodes and the first connection parts may be connected with each other to be an integral structure. Second connection parts may be disposed on the first touch electrode layer to make adjacent second touch electrodes be connected with each other through via(s), the touch dielectric layer is disposed between the first touch electrode layer and the second touch electrode layer. In some possible implementation modes, the plurality of first touch electrodes, the plurality of second touch electrodes, and the plurality of second connection parts may be disposed on a same layer and on the second touch electrode layer, the second touch electrodes and the second connection parts may be connected with each other to be an integral structure. The first connection parts may be disposed on the first touch electrode layer to make adjacent first touch electrodes be connected with each other through via(s). In an exemplary implementation mode, the first touch electrodes may be drive electrodes (Tx) and the second touch electrodes may be sensing electrodes (Rx). Or, the first touch electrodes may be sensing electrodes (Rx) and the second touch electrodes may be drive electrodes (Tx).

With development of display apparatuses, an OLED display technology shows great potentials. An OLED has wide application space because of its excellent display performance, but with development of technologies, higher requirements are put forward for integration of a screen. In a Flexible Multi-Layer On Cell (FMLOC) technology, a screen and touch are integrated into one, so that an integration degree of a display apparatus is greatly improved. The FMLOC technology has become a development trend of the display industry.

When the FMLOC technology is used, both a substrate and FMLOC may have cracks. Once there is a crack, even a tiny crack, water vapor may easily penetrate into a display panel along the crack, which affects a wiring or a circuit in the display panel, resulting in poor display and reduced service life.

An embodiment of the present disclosure provides a display substrate, a drive circuit layer is detected through a first crack detection line, a touch structure layer is detected through a second crack detection line, which realizes respective detection of cracks on the drive circuit layer and the touch structure layer, so that specific positions of cracks may be detected, which is beneficial to accurately locate the cracks in processes of product production and related defect analysis, thus improving a product yield.

Crack detection is divided into Back Plate (BP) section detection and module section detection, and the BP section detection is to electrically connect test unit pin(s) (Electrical Test (ET) pin) with the first crack detection line for detection; the module section detection is to electrically connect Flexible Printed Cable pin(s) (FPC pin) with the second crack detection lined for detection (optionally, first, the second crack detection line is connected with input pin(s) of a driver chip (Integrated Circuit (IC)), and then output pin(s) of the driver chip is electrically connected with the FPC pin(s) through wirings).

The first crack detection line has two loops, which are respectively on left and right sides of a display panel. One end of the first crack detection line is connected with one or more green data lines through one or more first transistors in a test unit, and the other end is connected to a high voltage (VGH) signal through a pin, and the VGH signal may be provided by an FPC.

A detection principle: when a crack occurs, a green bright line appears under a black picture, it may be determined that there is a crack.

Generally, when there is no crack around the display substrate, the first crack detection line is at a high voltage (6 V), which is input to a corresponding sub-pixel, so that a current flowing through a light emitting device (e.g. an OLED) of the sub-pixel is relatively small. The light emitting device hardly emits light and presents a black state.

A formula of a current is as follows.

$$ID1 = K(Vgs - Vth)^2$$
$$= K[(Vdata + Vth - VDD) - Vth]^2$$
$$= K(Vdata - VDD)^2$$

In the above formula, Vth denotes a threshold voltage of a first transistor T1, Vgs denotes a voltage between a gate and a source of the first transistor T1, and K is a constant value.

When there is a crack in the display panel, it may be considered that a detected voltage signal at this time is approximately 0 V. A current flowing through a light emitting device of this column of sub-pixels is relatively large, the light emitting device emits light, and green pixels will be lit, that is, a green bright line will appear in a black picture, and it is determined that a crack appears in the display panel.

In order to realize crack detection of the touch structure layer and the back plate (BP) at the same time, touch wirings in a back plate (BP) film layer and an FMLOC film layer need to be connected through vias, a first planarization layer (PLN) and a Pixel Definition Layer (PDL) film layer are dug off above a second source drain metal layer (SD2) of the back plate, at the same time, the Touch Dielectric Layer (TLD) is designed by digging holes in an FMLOC process, realizing that a metal of the second touch electrode layer (Touch Metal Two (TMB)) and a metal of the second source drain metal layer of the back plate are lapped joint in the FMLOC process, so that a signal of a chip (IC) terminal may be transmitted from the IC terminal to the FMLOC film layer through the BP film layer, thus realizing a crack detection function.

However, it is found that the TLD itself is an inorganic layer with a thickness of 300 nm. In a first process of the FMLOC process, Chemical Vapor Deposition (CVD) is first performed on an inorganic layer to form a buffer layer with a thickness of 200 nm. In order to effectively realize a lap joint of the BP film layer and the FMLOC film layer, etching needs to be performed for a TLD process, and it must be over-etching to ensure that the buffer layer of 200 nm is over-etched. However, in an actual process, the over-etching of the TLD is far more than that, and it will continue to be over-etched down, which will etch an organic film layer of the BP, and continue to etch between 200 nm and 300 nm. Since an etching boundary of the TLD is located above the first planarization layer, and a thickness of the first planarization layer covering the second source drain metal layer itself is relatively thin, about 400 nm to 500 nm, when a TLD over-etching process fluctuates greatly, it will cause an over-etching, to expose the metal of the second source drain metal layer while a groove is formed, and the metal of the TMB will remain here, which will cause the metal of the second source drain metal layer on the second crack detection line to be connected with the metal of the second source drain metal layer on the first crack detection line through the TMB, resulting in a short circuit, and then a normal crack detection function cannot be carried out.

Figure 4:
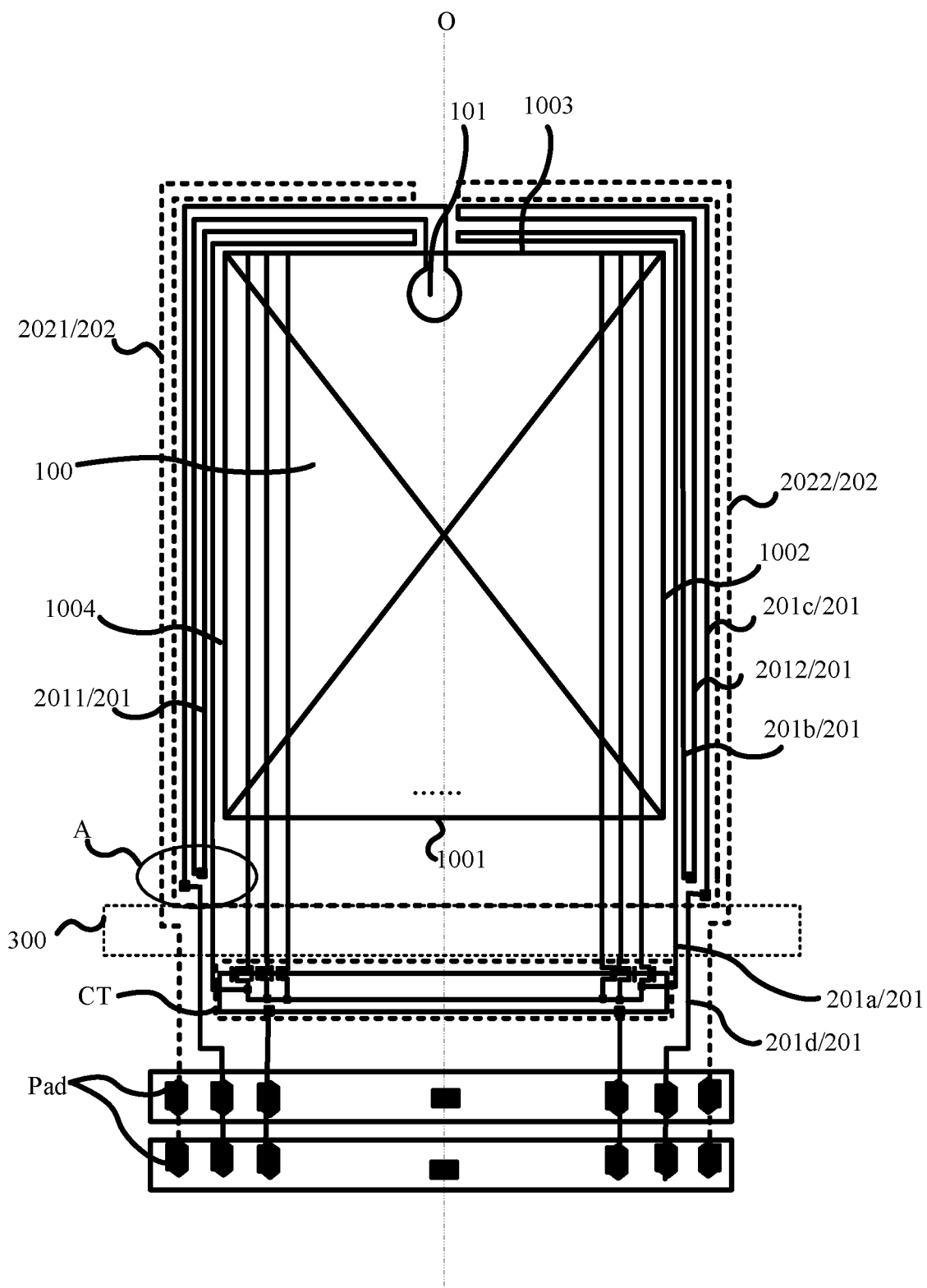
FIG. 4 is a schematic diagram of a structure of a display substrate according to an exemplary embodiment of the present disclosure.
Figure 5A:
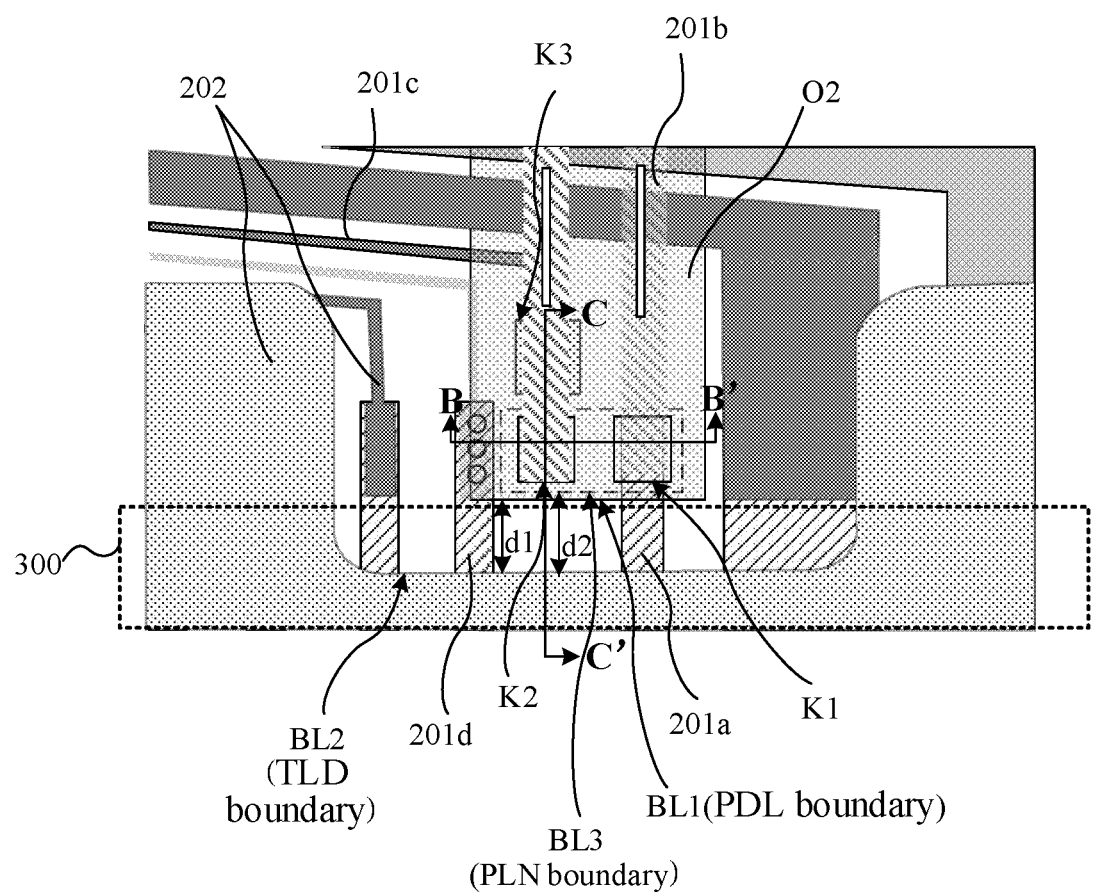
FIGS. 5a and 5b are two enlarged schematic diagrams of a structure of an A region in FIG. 4.
Figure 5B:
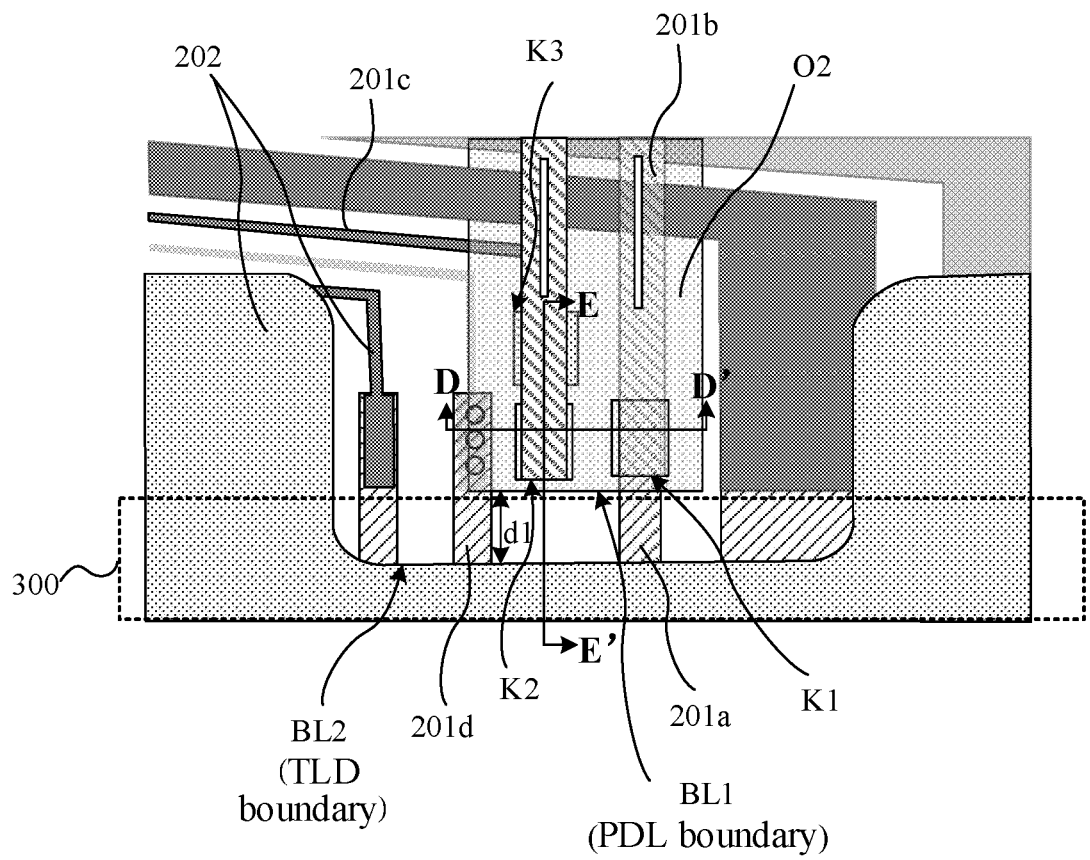

FIG. 4 is a schematic diagram of a structure of a display substrate according to an exemplary embodiment of the present disclosure, FIGS. 5a and 5b are two enlarged schematic diagrams of a structure of an A region in FIG. 4. As shown in FIGS. 4, 5a, and 5b, an embodiment of the present disclosure provides a display substrate including a display region 100 and a peripheral region located at a periphery of the display region, and the peripheral region includes a bending region 300 located on one side of the display region 100.

The display substrate includes: a first crack detection line 201 which is located in the peripheral region and at least partially surrounds the display region 100, the first crack detection line 201 includes a first lead segment 201a, a second lead segment 201b, a third lead segment 201c, and a fourth lead segment 201d, the first lead segment 201a and the fourth lead segment 201d are at least partially located in the bending region 300, the second lead segment 201b and the third lead segment 201c at least partially surround the display region 100, one end of the first lead segment 201a is connected with one end of the second lead segment 201b through a first via, the other end of the second lead segment 201b is connected with one end of the third lead segment 201c through a second via, and the other end of the third lead segment 201c is connected with one end of the fourth lead segment 201d.

Figure 6A:
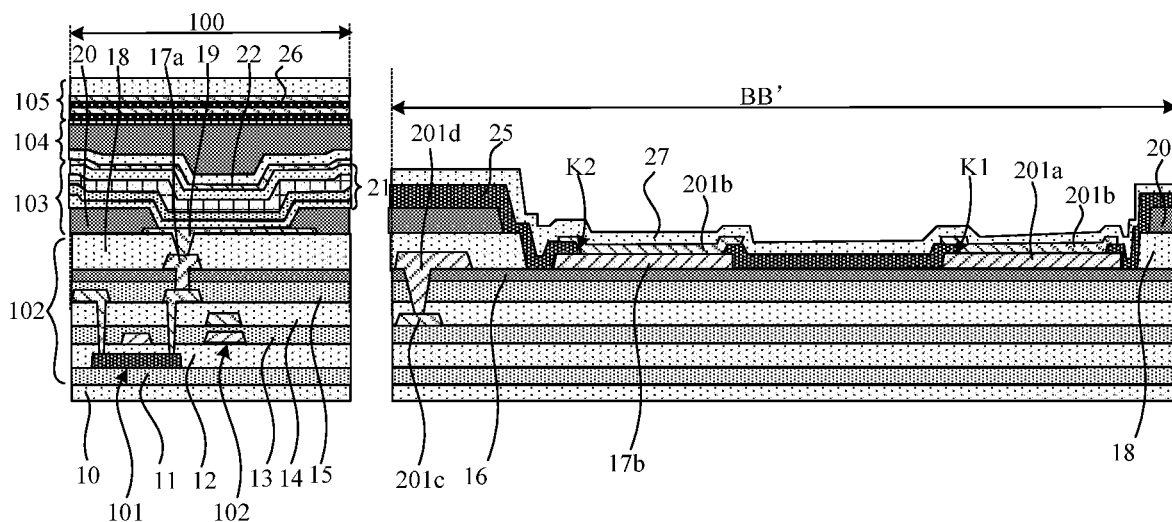
FIG. 6a is schematic diagrams of sectional structures of a BB' region in FIG. 5a and a display region.
Figure 6B:
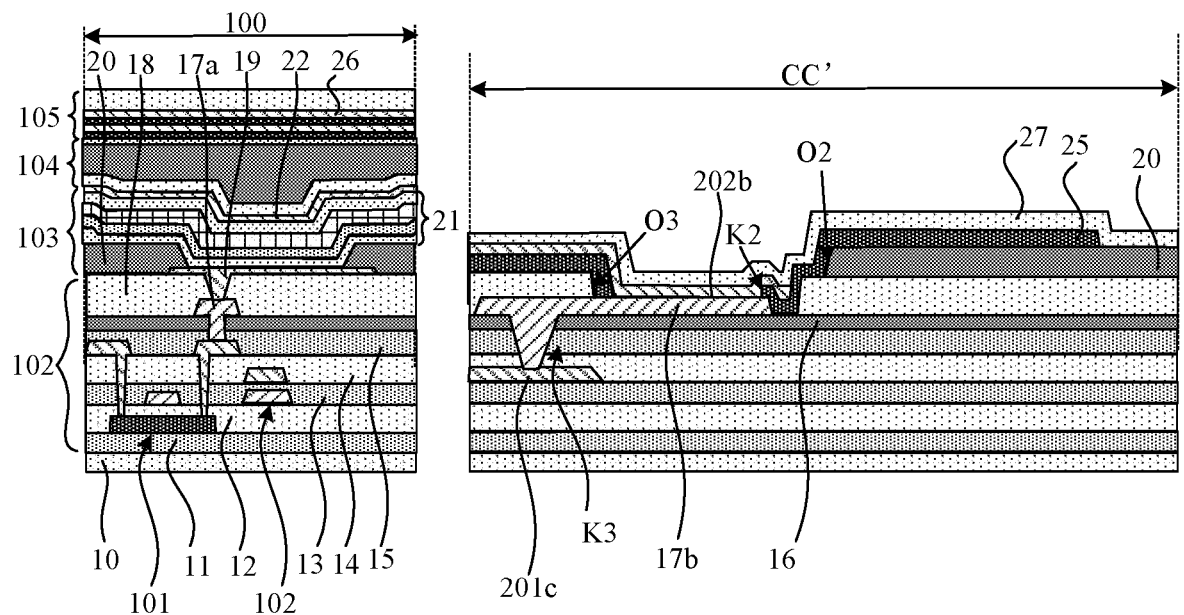
FIG. 6b is schematic diagrams of sectional structures of a CC' region in FIG. 5a and a display region.
Figure 7A:
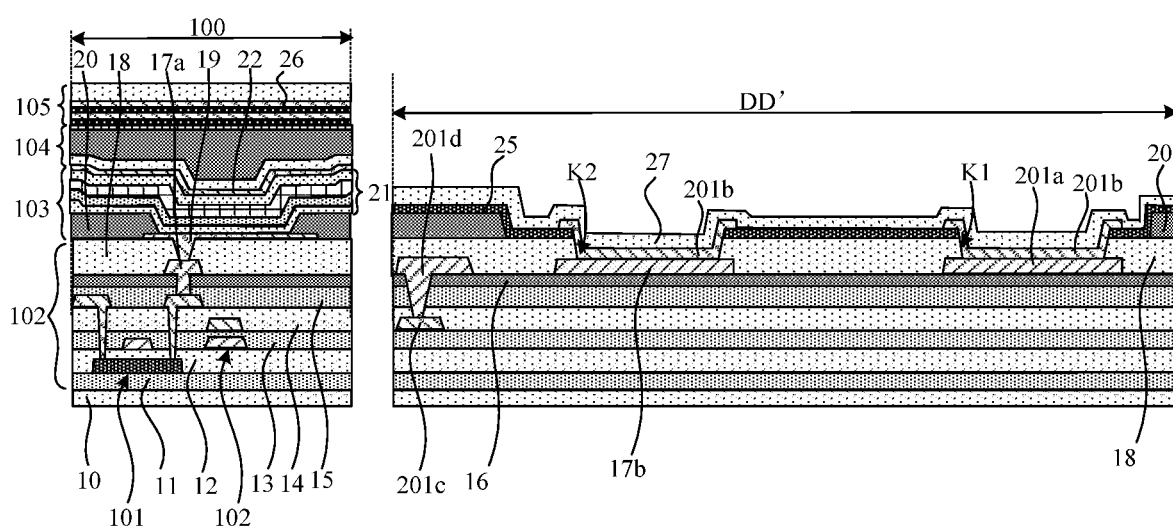
FIG. 7a is schematic diagrams of sectional structures of a DD' region in FIG. 5b and a display region.
Figure 7B:
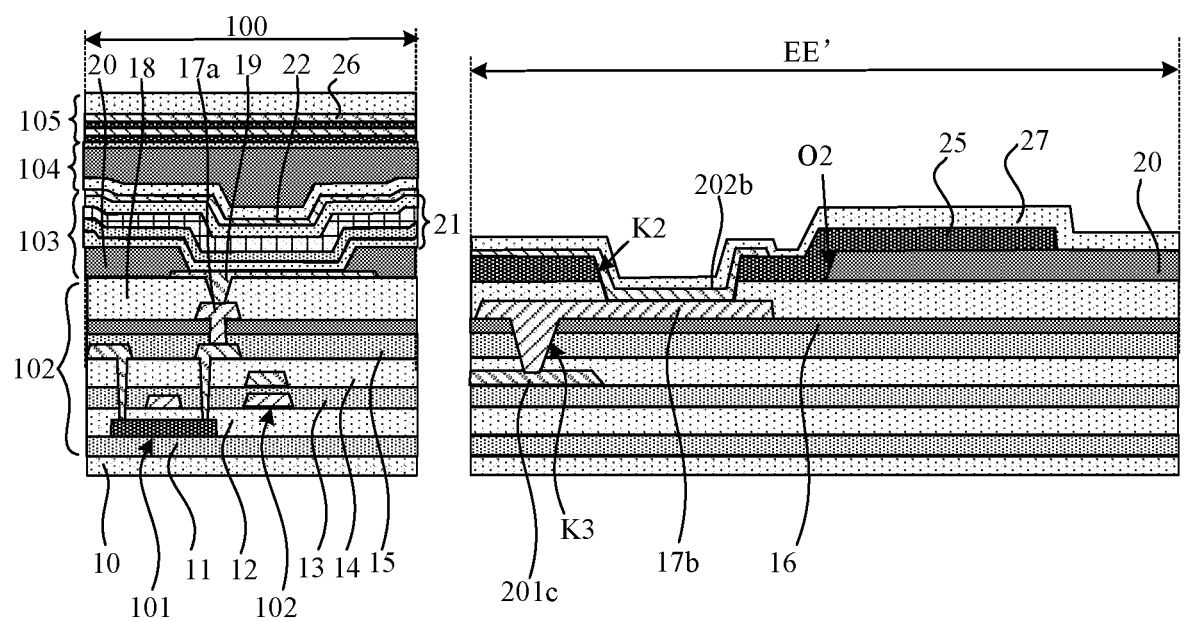
FIG. 7b is schematic diagrams of sectional structures of an EE' region in FIG. 5b and a display region.

FIG. 6a is schematic diagrams of sectional structures of a BB' region in FIG. 5a and a display region, FIG. 6b is schematic diagrams of sectional structures of a CC' region in FIG. 5a and a display region, FIG. 7a is schematic diagrams of sectional structures of a DD' region in FIG. 5b and a display region, and FIG. 7b is schematic diagrams of sectional structures of an EE' region in FIG. 5b and a display region. As shown in FIGS. 6a, 6b, 7a, and 7b, in an exemplary implementation mode, in a plane perpendicular to the display substrate, the display substrate may include a base substrate 10, a drive circuit layer 102 disposed on the base substrate 10, a Pixel Definition Layer (PDL) 20 and a light emitting structure layer 103 which are disposed on a side of the drive circuit layer 102 away from the base substrate 10, an encapsulation layer 104 disposed on a side of the pixel definition layer 20 and the light emitting structure layer 103 away from the base substrate 10, and a touch structure layer 105 disposed on a side of the encapsulation layer 104 away from the base substrate 10. The pixel definition layer 20 has a plurality of first openings (not shown in the figures) in the display region 100, and the plurality of first openings are configured to accommodate the light emitting structure layer 103.

The touch structure layer 105 includes a Touch Dielectric Layer (TLD) 25 and a second touch electrode layer (Touch Metal Two (TMB)) 26 located on a side of the touch dielectric layer 25 away from the pixel definition layer 20;

wherein the pixel definition layer 20 has a first boundary BL1 on a side of a first via K1 away from the display region 100, and the touch dielectric layer 25 has a second boundary BL2 on the side of the first via K1 away from the display region 100, and the second boundary BL2 is located on a side of the first boundary BL1 away from the display region 100.

The pixel definition layer 20 has a second opening O2 in the peripheral region, and an orthographic projection of the first via K1 on the base substrate 10 is located within an orthographic projection of the second opening O2 on the base substrate 10. In some other exemplary implementation modes, the orthographic projection of the first via K1 on the base substrate 10 may also be partially overlapped with the orthographic projection of the second opening O2 on the base substrate 10.

In an exemplary implementation mode, as shown in FIGS. 6a, 6b, 7a, and 7b, in a plane perpendicular to the base substrate 10, the drive circuit layer 102 includes a first insulation layer 11, an active layer, a second insulation layer 12, a first gate metal layer, a third insulation layer 13, a second gate metal layer, a fourth insulation layer 14, a first source drain metal layer, a fifth insulation layer 15, a second planarization layer 16, and a second source drain metal layer that are stacked in sequence on the base substrate.

In an exemplary implementation mode, as shown in FIGS. 6a, 6b, 7a, and 7b, in a plane perpendicular to the base substrate 10, the touch structure layer 105 includes a buffer layer, a first touch electrode layer (Touch Metal One (TMA)) disposed on the buffer layer, a Touch Dielectric Layer (TLD) 25 disposed on the first touch electrode layer, a second touch electrode layer (Touch Metal Two (TMB)) 26 disposed on the touch dielectric layer 25, and a protective layer disposed on the second touch electrode layer 26.

In an exemplary implementation mode, a second crack detection line 202, the first lead segment 201a, the third lead segment 201c, and the fourth lead segment 201d are disposed in a same layer as any one or more of the first gate metal layer, the second gate metal layer, the first source drain metal layer, and the second source drain metal layer, and the second lead segment 201b is disposed in a same layer as the second touch electrode layer or the first touch electrode layer.

In an exemplary implementation mode, as shown in FIGS. 6a, 6b, 7a, and 7b, the third lead segment 201c is disposed in a same layer as the second gate metal layer, the second crack detection line 202, the first lead segment 201a, and the fourth lead segment 201d are disposed in a same layer as the second source drain metal layer, and the second lead segment 201b is disposed in a same layer as the second touch electrode layer 26.

In an exemplary implementation mode, as shown in FIGS. 5a and 5b, a shortest distance d1 between the first boundary BL1 and the second boundary BL2 is greater than 20 microns.

In an exemplary implementation mode, as shown in FIGS. 5a, 6a, and 6b, the display substrate further includes a first planarization layer (PLN) 18 located between the drive circuit layer 102 and the pixel definition layer 20, the first planarization layer 18 has a third boundary BL3 on a side away from the first via K1, and the second boundary BL2 is located on a side of the third boundary BL3 away from the display region 100.

In an exemplary implementation mode, as shown in FIG. 5a, a shortest distance d2 between the second boundary BL2 and the third boundary BL3 is greater than 20 microns.

In an exemplary implementation mode, as shown in FIGS. 5a and 5b, a shortest distance between the first via K1 and the second boundary BL2 and a shortest distance between the second via K2 and the second boundary BL2 are equal.

In an exemplary implementation mode, as shown in FIGS. 5a and 5b, the display substrate further includes a third via K3 located on a side of the first via K1 close to the display region 100, and the third via K3 electrically connects the second lead segment 201b and the third lead segment 201c.

In an exemplary implementation mode, as shown in FIGS. 5a and 5b, an orthographic projection of the second via K2 on the base substrate 10 is located within an orthographic projection of the second opening O2 on the base substrate 10.

In an exemplary implementation mode, as shown in FIGS. 6b and 7b, the touch dielectric layer 25 covers the third via K3 and at least part of the third lead segment 201c.

In an exemplary implementation mode, as shown in FIG. 5a, the second boundary BL2 is located in the bending region 300, and the third boundary BL3 is located on a side of the first boundary BL1 close to the display region 100.

In an exemplary implementation mode, as shown in FIG. 4, the display substrate further includes a plurality of pads located on a side of the bending region 300 away from the display region 100.

The display substrate further includes a test circuit CT located between the bending region 300 and the plurality of pads, and the other end of the first lead segment 201a is electrically connected with the test circuit CT.

Figure 8:
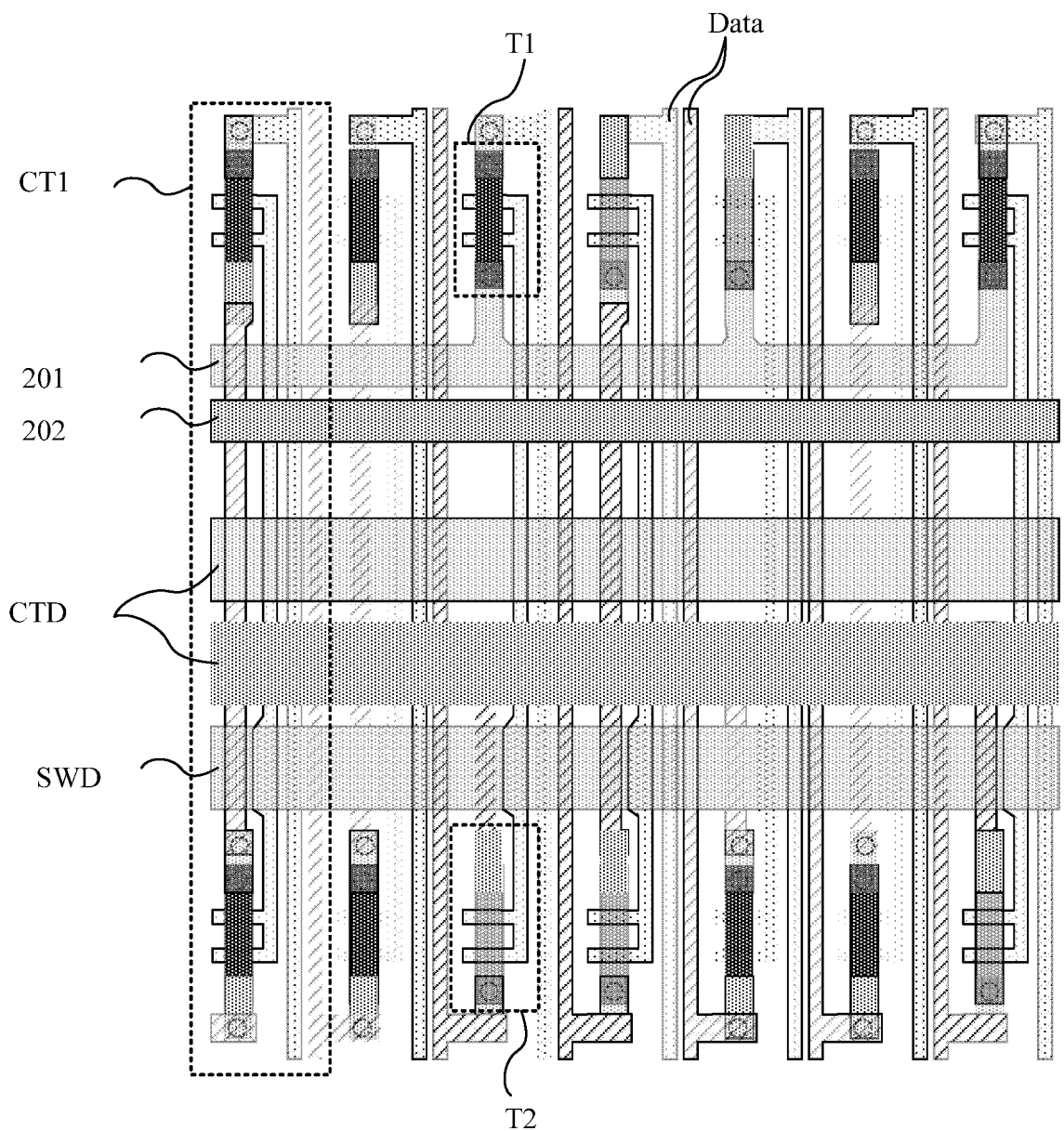
FIG. 8 is a schematic diagram of a structure of a test circuit according to an exemplary embodiment of the present disclosure.

FIG. 8 is a schematic diagram of a structure of a test circuit according to an embodiment of the present disclosure, as shown in FIG. 8, in an exemplary implementation mode, the test circuit CT includes a plurality of test units CT1, at least one of the plurality of test units CT1 includes a first transistor T1 and a second transistor T2, control terminals of the first transistor T1 and the second transistor T2 are connected with a test control line SWD, first terminals of the first transistor T1 and the second transistor T2 are configured to be electrically connected with a data line Data, a second terminal of the first transistor T1 is configured to be electrically connected with the first crack detection line 201, and a second terminal of the second transistor T2 is configured to be electrically connected with a detection data line CTD.

In an exemplary implementation mode, as shown in FIG. 4, the other end of the fourth lead segment 201d is electrically connected with at least one of the plurality of pads.

In an exemplary implementation mode, as shown in FIGS. 4, 5a, and 5b, the display region 100 includes a first edge 1001, a second edge 1002, a third edge 1003, and a fourth edge 1004 connected in sequence, and the first via K1 is located in the peripheral region close to the first edge 1001.

In an exemplary implementation mode, the second lead segment 201b is located in the peripheral region close to the first edge 1001, the second edge 1002, the third edge 1003, and the fourth edge 1004.

The third lead segment 201c is located in the peripheral region close to the first edge 1001, the second edge 1002, the third edge 1003, and the fourth edge 1004.

In an exemplary implementation mode, as shown in FIG. 4, the display region includes a camera hole 101, and the third lead segment 201c is wound around the camera hole 101.

In an exemplary implementation mode, as shown in FIG. 4, the display substrate further includes the second crack detection line 202 which is located in the peripheral region and at least partially surrounds the display region 100, the second crack detection line 202 includes a first end and a second end, and the first end and the second end are connected with at least one of the plurality of pads respectively.

In an exemplary implementation mode, as shown in FIG. 4, the second crack detection line 202 is left-right symmetrical with respect to a center line O of the display region 100.

In an exemplary implementation mode, as shown in FIG. 4, the first crack detection line 201 includes a first sub-line 2011 on one side of the center line O and a second sub-line 2012 on the other side of the center line O, and the second crack detection line 202 includes a third sub-line 2021 on one side of the center line O and a fourth sub-line 2022 on the other side of the center line O.

The first sub-line 2011 is located in the peripheral region close to the first edge 1001, the third edge 1003, and the fourth edge 1004, and the second sub-line 2012 is located in the peripheral region close to the first edge 1001, the second edge 1002, and the third edge 1003.

The third sub-line 2021 is located in the peripheral region close to the first edge 1001, the third edge 1003, and the fourth edge 1004, and the fourth sub-line 2022 is located in the peripheral region close to the first edge 1001, the second edge 1002, and the third edge 1003.

In the embodiment of the present disclosure, the first crack detection line 201 may detect whether a crack occurs in the back plate through bright line detection; the second crack detection line 202 may detect whether a crack occurs in the back plate through resistance detection.

In an exemplary implementation mode, the first via K1 includes two vias, the second via K2 includes two vias, the two first vias K1 are left-right symmetrical with respect to the center line O of the display region 100, and the two second vias K2 are left-right symmetrical with respect to the center line O of the display region 100.

In an exemplary implementation mode, the first via K1 and the second via K2 are located between the display region 100 and the bending region 300.

In the display substrate of the embodiment of the present disclosure, the pixel definition layer 20 has the first boundary BL1 on the side of the first via K1 away from the display region 100, the touch dielectric layer 25 has the second boundary BL2 on the side of the first via K1 away from the display region 100, and the second boundary BL2 is located on the side of the first boundary BL1 away from the display region 100, so that when the touch dielectric layer 25 is etched, even if over-etching occurs, the first crack detection line 201 and the second crack detection line 202 will not be short-circuited, thereby improving quality and a yield of a product.

Exemplary description is made below through a preparation process of the display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film formed by a material on a base substrate through deposition, coating, or other processes. If the "thin film" does not need a patterning process in an entire preparation process, the "thin film" may also be called a "layer". If the "thin film" needs the patterning process in the entire preparation process, it is called a "thin film" before the patterning process, and called a "layer" after the patterning process. A "layer" which has experienced a patterning process includes at least one "pattern". "A and B being arranged on a same layer" in the present disclosure means that A and B are formed simultaneously through a same patterning process, and a "thickness" of a film layer is a dimension of the film layer in a direction perpendicular to the display substrate. In an exemplary embodiment of the present disclosure, "an orthographic projection of B is within a range of an orthographic projection of A" refers to a boundary of the orthographic projection of B falling within a range of a boundary of the orthographic projection of A, or the boundary of the orthographic projection of A is overlapped with the boundary of the orthographic projection of B.

In an exemplary implementation mode, the preparation process of the display substrate may include following operations.

(1) A pattern of the drive circuit layer 102 is prepared on the base substrate 10. The drive circuit layer 102 includes a plurality of gate lines and a plurality of data lines, the plurality of gate lines and the plurality of data lines are intersected to define a plurality of pixel units arranged in a matrix, each pixel unit includes at least three sub-pixels, and each sub-pixel includes a Thin Film Transistor (TFT). In this embodiment, one pixel unit includes three sub-pixels, namely a red sub-pixel R, a green sub-pixel G, and a blue sub-pixel B respectively. Of course, a solution of this embodiment is also applicable to a case where one pixel unit includes four sub-pixels (a red sub-pixel R, a green sub-pixel G, a blue sub-pixel B, and a white sub-pixel W).

In an exemplary implementation mode, the base substrate 10 may be a flexible base substrate or a rigid base substrate. In an exemplary implementation mode, the flexible base substrate may include a first flexible material layer, a first inorganic material layer, a semiconductor layer, a second flexible material layer, and a second inorganic material layer which are stacked. Materials of the first and second flexible material layers may be Polyimide (PI), Polyethylene Terephthalate (PET), or a polymer soft film subjected to a surface treatment, etc., materials of the first and second inorganic material layers may be Silicon Nitride (SiNx), Silicon Oxide (SiOx), or the like, so as to improve a water-oxygen resistance capability of the base substrate, the first and second inorganic material layers are also referred to as barrier layers. A material of the semiconductor layer may be amorphous silicon (a-si). In an exemplary implementation mode, taking one stacked layer structure as an example, a preparation process thereof may include: first, coating a layer of polyimide on a glass carrier plate, and forming a first flexible (PI1) layer after curing into a film; then depositing a layer of barrier thin film on the first flexible layer to form a first barrier (Barrier1) layer covering the first flexible layer; then depositing a layer of amorphous silicon thin film on the first barrier layer to form an amorphous silicon (a-si) layer covering the first barrier layer; then coating a layer of polyimide on the amorphous silicon layer, and forming a second flexible (PI2) layer after curing into a film; then, depositing a layer of barrier thin film on the second flexible layer to form a second barrier (Barrier2) layer covering the second flexible layer, thereby completing preparation of the base substrate 10.

In an exemplary implementation mode, a preparation process of the drive circuit layer 102 may include following acts.

A first insulation thin film and an active layer thin film are sequentially deposited on the base substrate 10, the active layer thin film is patterned through a patterning process to form the first insulation layer 11 covering the whole base substrate 10 and a pattern of the active layer disposed on the first insulation layer 11, the pattern of the active layer is formed in the display region 100 and at least includes a first active layer. After this patterning process, the peripheral region includes the first insulation layer 11 disposed on the base substrate 10.

Then, a second insulation thin film and a first metal thin film are sequentially deposited and the first metal thin film is patterned through a patterning process to form the second insulation layer 12 covering the pattern of the active layer and a pattern of a first gate metal layer disposed on the second insulation layer 12, the pattern of the first gate metal layer is formed in the display region 100 and at least includes a first gate electrode, a first capacitor electrode, a plurality of gate lines (not shown), and a plurality of gate leads (not shown). After this patterning process, the peripheral region includes the first insulation layer 11 and the second insulation layer 12 that are stacked on the base substrate 10.

Then, a third insulation thin film and a second metal thin film are sequentially deposited and the second metal thin film is patterned through a patterning process to form the third insulation layer 13 covering the first gate metal layer and a pattern of a second gate metal layer disposed on the third insulation layer 13, the pattern of the second gate metal layer is formed in the display region 100 and at least includes a second capacitor electrode and a second gate lead (not shown), a position of the second capacitor electrode corresponds to a position of the first capacitor electrode. After this patterning process, the peripheral region includes the first insulation layer 11, the second insulation layer 12, and the third insulation layer 13 that are stacked on the base substrate 10. At least one of the first gate metal layer and the second gate metal layer further includes the second crack detection line 202 and the third lead segment 201c of the first crack detection line 201.

Then, a fourth insulation thin film is deposited, the fourth insulation thin film is patterned through a patterning process to form a pattern of the fourth insulation layer 14 covering the second gate metal layer, the fourth insulation layer 14 is provided with multiple first opening holes which are formed in the display region 100, positions of the multiple first opening holes correspond to positions of two ends of the first active layer respectively, the fourth insulation layer 14, the third insulation layer 13, and the second insulation layer 12 in the multiple first opening holes are etched away to expose a surface of the first active layer respectively. After this patterning process, the peripheral region includes the first insulation layer 11, the second insulation layer 12, the third insulation layer 13, and the fourth insulation layer 14 that are stacked on the base substrate 10.

Then, a third metal thin film is deposited, the third metal thin film is patterned through a patterning process to form a pattern of a source drain metal layer on the fourth insulation layer 14, the source drain metal layer is formed in the display region 100 and at least includes patterns of a first source electrode, a first drain electrode, a low voltage (VSS) line (not shown), a plurality of data lines (not shown), and a plurality of data leads (not shown), the first source electrode and the first drain electrode are respectively connected with the first active layer through the first opening holes. In an exemplary implementation mode, the source drain metal layer may further include any one or more of a power supply line (VDD), a compensation line, and an auxiliary cathode according to actual needs. The source drain metal layer is also called a first source drain metal layer (SD1). After this patterning process, the peripheral region includes the first insulation layer 11, the second insulation layer 12, the third insulation layer 13, and the fourth insulation layer 14 that are stacked on the base substrate 10.

Figure 9:
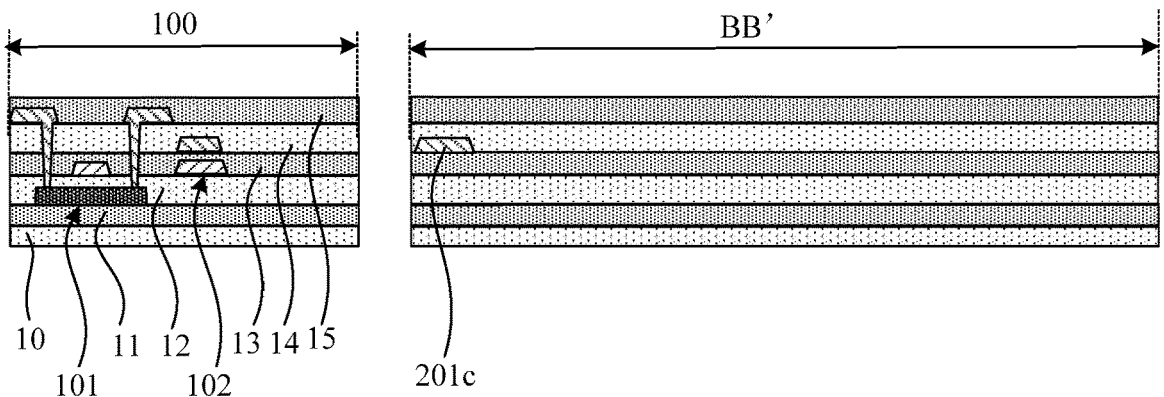
FIG. 9 is schematic diagrams of a BB' region in FIG. 5a and a display region after a pattern of a fifth insulation layer is formed.
Figure 10:
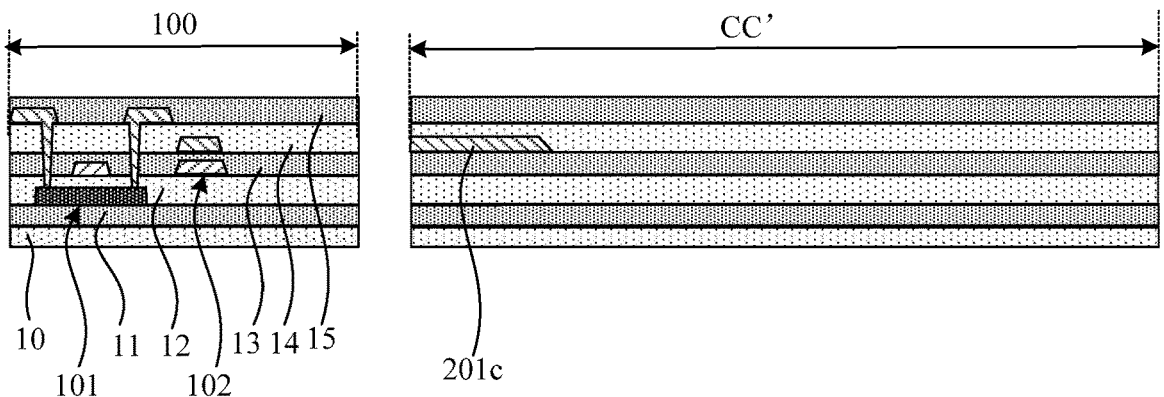
FIG. 10 is schematic diagrams of the CC' region in FIG. 5a and a display region after a pattern of a fifth insulation layer is formed.

Then, a fifth insulation thin film is deposited to form a pattern of the fifth insulation layer 15 covering the source drain metal layer. After this patterning process, the peripheral region includes a composite insulation layer disposed on the base substrate 10, the composite insulation layer includes the first insulation layer 11, the second insulation layer 12, the third insulation layer 13, the fourth insulation layer 14, and the fifth insulation layer 15 which are stacked, as shown in FIGS. 9 and 10.

A second planarization thin film is coated on the base substrate 10 on which the aforementioned patterns are formed to form the second planarization (PLN) layer 16 covering the entire base substrate 10, a second opening hole is formed on the second planarization layer 16 through a patterning process, the second opening hole is formed in the display region 100, and the second planarization layer 16 and the fifth insulation layer 15 in the second opening hole are etched away to expose a surface of a drain electrode of the thin film transistor 101. After this patterning process, the peripheral region includes the composite insulation layer disposed on the base substrate 10 and the second planarization layer 16 disposed on the composite insulation layer. In an exemplary implementation mode, the third via K3 may also be provided on the second planarization layer 16 and the fifth insulation layer 15, and the third via K3 exposes the third lead segment 201c.

Figure 11:
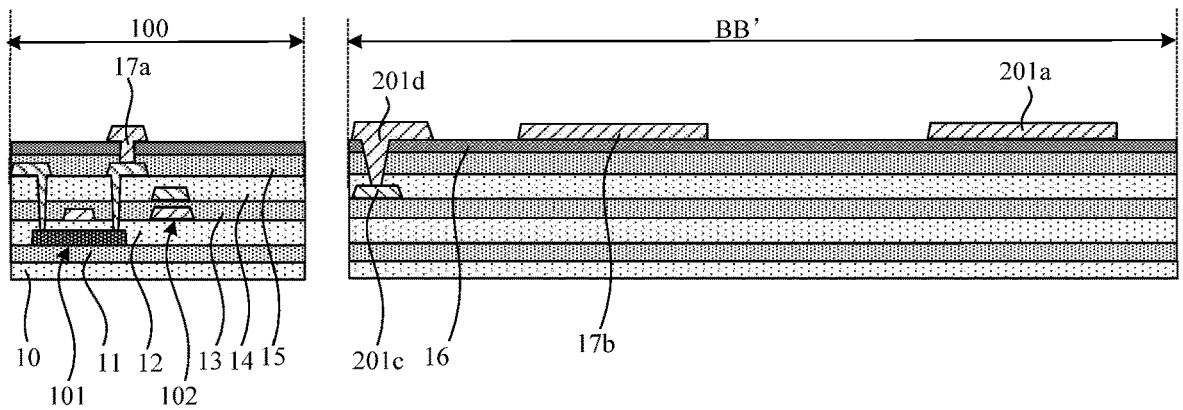
FIG. 11 is schematic diagrams of the BB' region in FIG. 5a and a display region after a pattern of a second source drain metal layer is formed.
Figure 12:
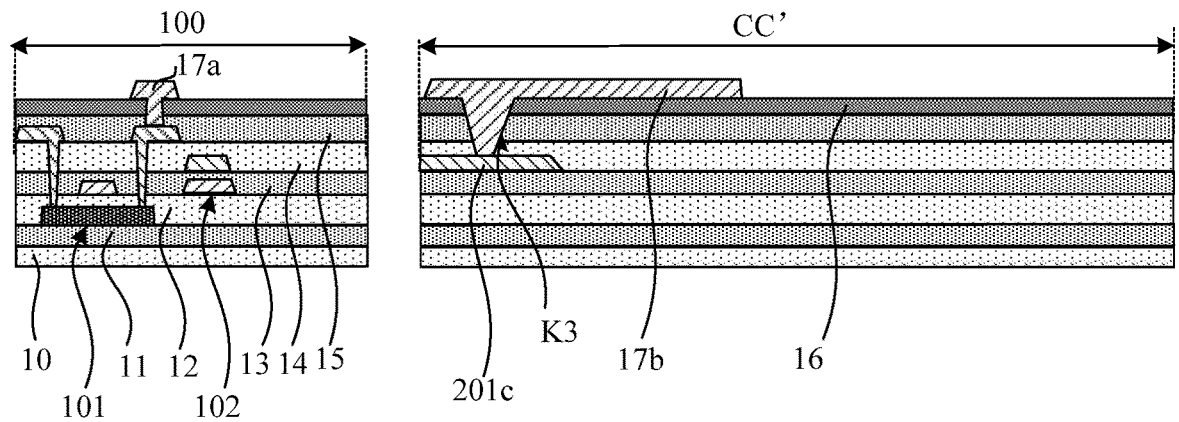
FIG. 12 is schematic diagrams of the CC' region in FIG. 5a and a display region after a pattern of a second source drain metal layer is formed.

A fourth metal thin film is deposited on the base substrate on which the aforementioned patterns are formed, the fourth metal thin film is patterned through a patterning process to form a pattern of a metal conductive layer on the second planarization layer 16, the metal conductive layer at least includes a first connection electrode 17a, a second connection electrode 17b, the first lead segment 201a, and the fourth lead segment 201d, the first connection electrode 17a is formed in the display region 100 and is connected with a first drain electrode of the first transistor 101 through a second opening hole, the second connection electrode 17b, the first lead segment 201a, and the fourth lead segment 201d are formed in the peripheral region, the second connection electrode 17b is configured to connect the second lead segment 201b and the third lead segment 201c that are subsequently formed through the third via K3. The fourth lead segment 201d may be electrically connected with the third lead segment 201c through vias on an intermediate plurality of insulation layers, as shown in FIGS. 11 and 12. In an exemplary implementation mode, the metal conductive layer is also referred to as a second source drain metal layer (SD2), which may further include any one or more of a power supply line, a power supply lead, a low voltage lead, and an auxiliary cathode according to an actual design.

Figure 13:
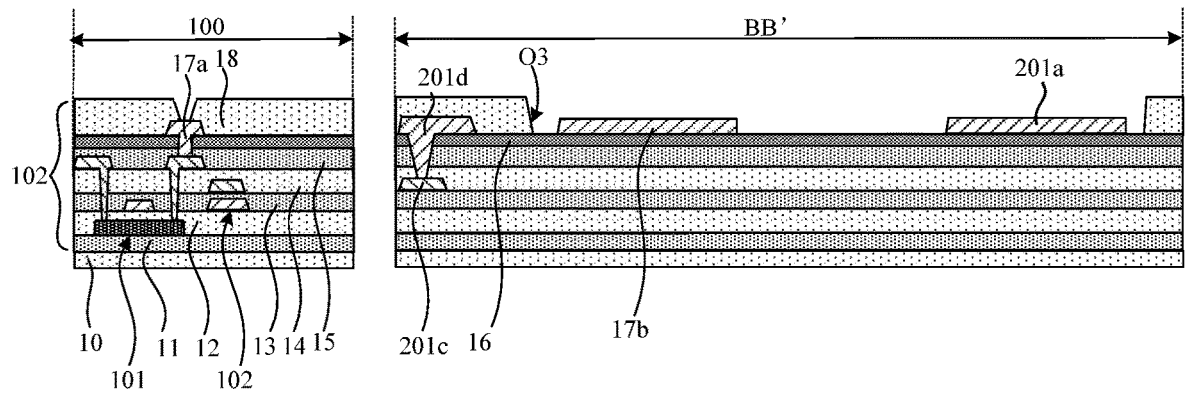
FIG. 13 is schematic diagrams of the BB' region in FIG. 5a and a display region after a pattern of a first planarization layer is formed.
Figure 14:
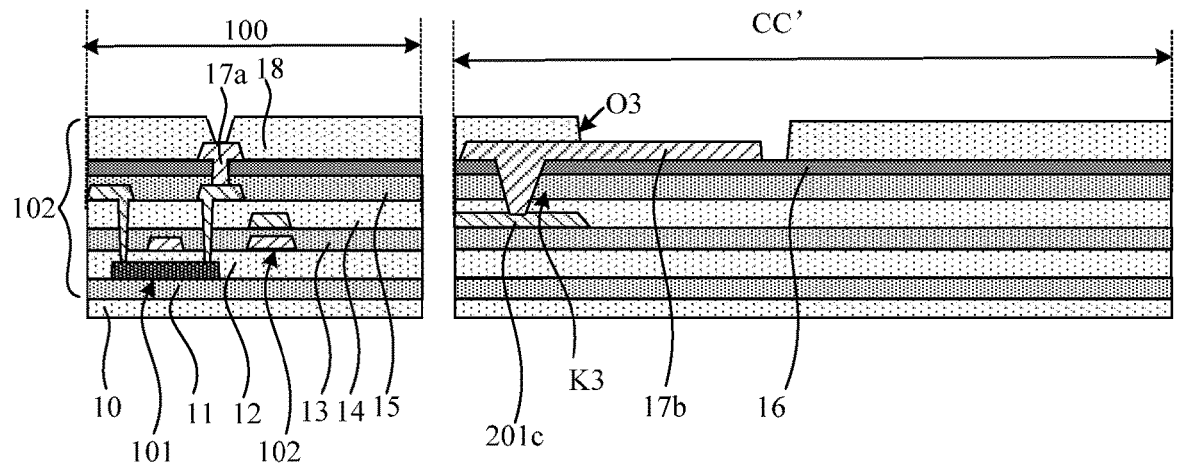
FIG. 14 is schematic diagrams of the CC' region in FIG. 5a and a display region after a pattern of a first planarization layer is formed.

A first planarization thin film is coated on the base substrate 10 on which the aforementioned patterns are formed, and a pattern of the first planarization layer 18 is formed on the second planarization layer 16 through masking, exposure, and development processes. In the display region 100, a third opening hole is provided on the first planarization layer 18, and the first planarization layer 18 in the third opening hole is developed to expose a surface of the first connection electrode 17a. In the peripheral region, a third opening O3 is provided on the first planarization layer 18, and the first planarization layer 18 in the third opening O3 is developed to expose surfaces of the first lead segment 201a and the second connection electrode 17b, as shown in FIGS. 13 and 14. In other exemplary implementation modes, the third opening O3 may also not be provided on the first planarization layer 18, and in the peripheral region, the first planarization layer 18 covers the first lead segment 201a and the second connection electrode 17b.

So far, the preparation of the pattern of the drive circuit layer on the base substrate 10 is completed. The first active layer, the first gate electrode, the first source electrode, and the first drain electrode form the first transistor 101, the first capacitor electrode and the second capacitor electrode form a first storage capacitor 102, and a plurality of gate leads and data leads form drive leads of Gate Driver on Array (GOA for short). In an exemplary implementation mode, the first transistor 101 may be a drive transistor in a pixel drive circuit, and the drive transistor may be a Thin Film Transistor (TFT for short).

Figure 15:
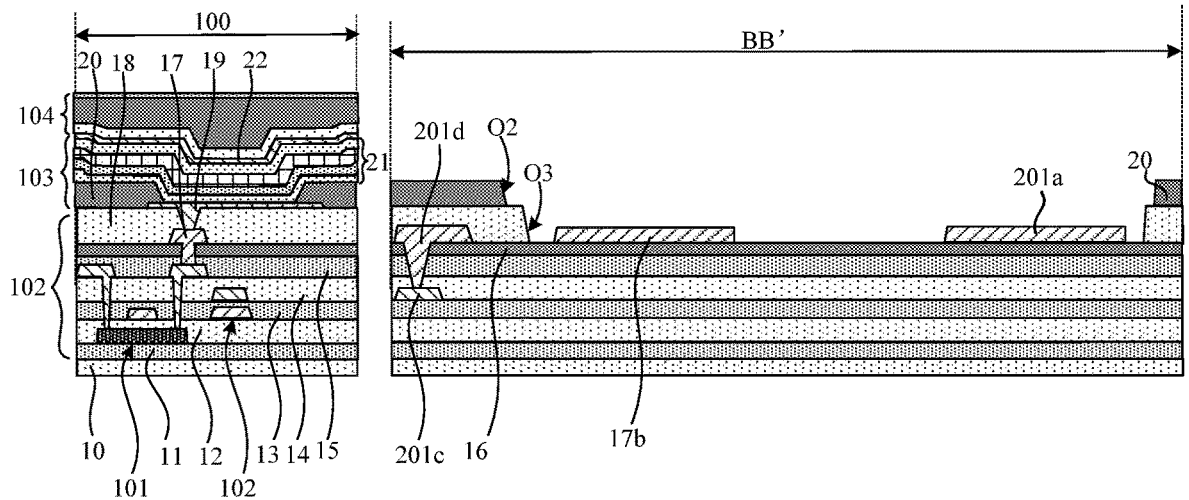
FIG. 15 is schematic diagrams of the BB' region in FIG. 5a and a display region after a pattern of an encapsulation layer is formed.
Figure 16:
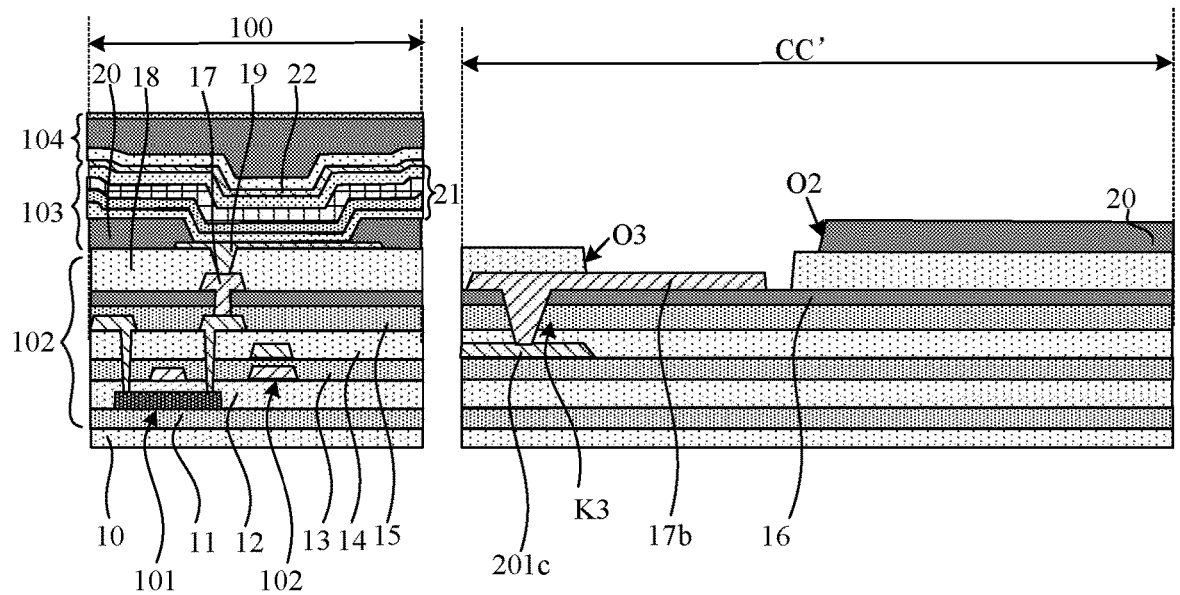
FIG. 16 is schematic diagrams of the CC' region in FIG. 5a and a display region after a pattern of an encapsulation layer is formed.

(2) Patterns of the light emitting structure layer 103 and the encapsulation layer 104 are prepared on the base substrate 10 on which the aforementioned patterns are formed, as shown in FIGS. 15 and 16. In an exemplary implementation mode, a preparation process of the light emitting structure layer 103 may include following acts.

A transparent conductive thin film is deposited on the base substrate 10 on which the aforementioned patterns are formed, and the transparent conductive thin film is patterned through a patterning process to form a pattern of the anode 19, the anode 19 is formed in the display region 100 and is connected with the first connection electrode 17a through the third opening hole.

A pixel definition thin film is coated on the base substrate 10 on which the aforementioned patterns are formed, a pattern of the Pixel Definition Layer (PDL) 20 is formed through masking, exposure, and development processes, the pixel definition layer 20 is formed in the display region 100 and the peripheral region, a first opening is provided on the pixel definition layer 20 of the display region 100, the pixel definition thin film in the first opening is developed to expose a surface of the anode 19, a second opening O2 is provided on the pixel definition layer 20 of the peripheral region, and the pixel definition thin film in the second opening O2 is developed to expose the third opening O3, that is, to expose surfaces of the first lead segment 201a and the second connection electrode 17b.

An organic material thin film is coated on the base substrate with the aforementioned patterns formed thereon, and patterns of multiple Pillar Spacers (PS) (not shown) are formed through masking, exposure, and development processes.

The organic emitting layer 21 and the cathode 22 are sequentially formed on the base substrate on which the abovementioned patterns are formed. The organic emitting layer 21 may include a hole injection layer, a hole transport layer, an emitting layer, an electron transport layer, and an electron injection layer that are stacked, and is formed in the display region 100, so as to achieve a connection between the organic emitting layer 21 and the anode 19. Since the anode 19 is connected with the first connection electrode 17a and the first connection electrode 17a is connected with the drain electrode of the first transistor 101, so that light emission control of the organic emitting layer 21 is achieved. The cathode 22 is connected with the organic emitting layer 21.

The encapsulation layer 104 is formed on the base substrate on which the aforementioned patterns are formed, the encapsulation layer 104 is formed in the display region 100, and made of a stacked layer structure of inorganic material/organic material/inorganic material, and an organic material layer is disposed between two inorganic material layers.

(3) A pattern of the touch structure layer 105 is formed on the base substrate on which the aforementioned patterns are formed, the touch structure layer 105 may include a buffer layer, a first touch electrode layer (i.e., a bridging layer), the Touch Dielectric Layer (TLD) 25, the second touch electrode layer 26, and the protective layer 27 that are stacked on the encapsulation layer 104, a plurality of first touch electrodes, a plurality of second touch electrodes, and a plurality of first connection parts may be disposed on a same layer and on the second touch electrode layer 26, and may be formed through a same patterning process, and the first touch electrodes and the first connection parts may be connected with each other to be an integral structure. Second connection parts may be disposed on the first touch electrode layer so that adjacent second touch electrodes are connected with each other through via(s), the touch dielectric layer 25 is disposed between the second touch electrode layer 26 and the first touch electrode layer. In some possible implementation modes, the plurality of first touch electrodes, the plurality of second touch electrode, and the plurality of second connection parts may be disposed on a same layer and on the second touch electrode layer 26, the second touch electrodes and the second connection parts may be connected with each other to be an integral structure, the first connection parts may be disposed on the first touch electrode layer so that adjacent first touch electrodes are connected with each other through via (s).

In an exemplary implementation mode, the Touch Dielectric Layer (TLD) 25 is provided with the first via K1 and the second via K2, the touch dielectric layer 25 in the first via K1 is developed to expose a surface of the first lead segment 201a, the touch dielectric layer 25 in the second via K2 is developed to expose a surface of the second connection electrode 17b. The second touch electrode layer 26 further includes a pattern of the second lead segment 201b, and the second lead segment 201b is connected with the first lead segment 201a through the first via K1, the second lead segment 201b is connected with the second connection electrode 17b through the second via K2, and since the second connection electrode 17b is connected with the third lead segment 201c through the third via K3, thus a connection between the second lead segment 201b and the third lead segment 201c is realized.

In an exemplary implementation mode, during preparation of a flexible display substrate, the preparation process of the display substrate may include processes such as peeling-off of a glass carrier plate, attaching of a back film, and cutting, which is not limited in the present disclosure.

As may be seen from the structure of the display substrate and the preparation process thereof in the exemplary embodiments of the present disclosure, according to the exemplary embodiment of the present disclosure, respective detection of cracks in the drive circuit layer 102 and the touch structure layer 105 is achieved by detecting the drive circuit layer 102 through the first crack detection line 201 and detecting the touch structure layer 105 through the second crack detection line 202, thus specific positions of the cracks may be detected, which is beneficial to accurately locate the cracks in processes of product production and related defect analysis, thus improving a product yield. In addition, the pixel definition layer 20 has the first boundary BL1 on the side of the first via K1 away from the display region 100, the touch dielectric layer 25 has the second boundary BL2 on the side of the first via K1 away from the display region 100, and the second boundary BL2 is located on the side of the first boundary BL1 away from the display region 100, so that when the touch dielectric layer 25 is etched, even if over-etching occurs, there will be no risk that the first crack detection line 201 and the second crack detection line 202 are short-circuited. The preparation method of the display substrate of the exemplary embodiment of the present disclosure has good process compatibility, simple process realization, easy implementation, high production efficiency, a low production cost, and a high yield.

The structure and its preparing process in the exemplary embodiment of the present disclosure are only exemplarily described. In an exemplary implementation mode, a corresponding structure may be changed and a patterning process may be added or reduced according to actual needs. For example, a transistor in the drive circuit layer 102 may have a top-gate structure or a bottom-gate structure, may have a single-gate structure or a double-gate structure. For another example, another film layer structure, electrode structure, or lead structure may also be provided in the drive circuit layer 102 and the light emitting structure layer 103. For another example, the base substrate may be a glass base substrate, which is not specifically limited in the present disclosure.

The present disclosure also provides a preparation method of a display substrate, the display substrate includes a display region and a peripheral region located at a periphery of the display region, the peripheral region includes a bending region located on one side of the display region, the peripheral region includes a first crack detection line, and the first crack detection line at least partially surrounds the display region, the first crack detection line includes a first lead segment, a second lead segment, a third lead segment, and a fourth lead segment, the first lead segment and the fourth lead segment are at least partially located in the bending region, the second lead segment and the third lead segment at least partially surround the display region, one end of the first lead segment is connected with one end of the second lead segment through a first via, the other end of the second lead segment is connected with one end of the third lead segment through a second via, and the other end of the third lead segment is connected with one end of the fourth lead segment. In an exemplary implementation mode, the method may include: forming a drive circuit layer on a base substrate; forming a pixel definition layer and a light emitting structure layer on the drive circuit layer, wherein the pixel definition layer is provided with a plurality of first openings in the display region, the plurality of first openings are configured to accommodate the light emitting structure layer; the pixel definition layer is provided with a second opening in the peripheral region, and an orthographic projection of the first via on the base substrate is located in an orthographic projection of the second opening on the base substrate; in other exemplary implementation modes, the orthographic projection of the first via on the base substrate may also be partially overlapped with the orthographic projection of the second opening on the base substrate; and forming a touch structure layer on the pixel definition layer and the light emitting structure layer, the touch structure layer includes a touch dielectric layer and a second touch electrode layer located on a side of the touch dielectric layer away from the pixel definition layer; wherein the pixel definition layer has a first boundary on a side of the first via away from the display region, the touch dielectric layer has a second boundary on the side of the first via away from the display region, and the second boundary is located on a side of the first boundary away from the display region.

In an exemplary implementation mode, the drive circuit layer includes an active layer, a first gate metal layer, a second gate metal layer, a first source drain metal layer, and a second source drain metal layer that are sequentially stacked on the base substrate.

The present disclosure provides a preparation method of a display substrate, respective detection of cracks in a drive circuit layer and a touch structure layer is realized by detecting the drive circuit layer through a first crack detection line and detecting a touch structure layer through a second crack detection line, so that specific positions of cracks may be detected, which is beneficial to accurately locate cracks in processes of product production and related defect analysis, thus improving a product yield. In addition, a pixel definition layer has a first boundary on a side of a first via away from a display region, a touch dielectric layer has a second boundary on the side of the first via away from the display region, and the second boundary is located on a side of the first boundary away from the display region, so that when the touch dielectric layer is etched, even if overetching occurs, there will be no risk that the first crack detection line and the second crack detection line are short-circuited. The preparation method of the display substrate of the exemplary embodiment of the present disclosure has good process compatibility, simple process realization, easy implementation, high production efficiency, a low production cost, and a high yield.

The present disclosure further provides a display apparatus including the display substrate in the aforementioned embodiments. The display device may be any product or component with a display function, such as a mobile phone, a tablet computer, a television, a display, a laptop computer, a digital photo frame, or a navigator.

Although the embodiments disclosed in the present disclosure are as above, the described contents are only embodiments used for convenience of understanding the present disclosure and are not intended to limit the present disclosure. Those skilled in the art may make any modification and change to a form and details of implementation without departing from the spirit and scope of the present disclosure. However, the scope of patent protection of the present disclosure should still be subject to the scope defined by the appended claims.

The invention claimed is:

1. A display substrate, comprising:
a base substrate comprising a display region and a peripheral region located at a periphery of the display region, wherein the peripheral region comprises a bending region located on one side of the display region; and
a first crack detection line is located in the peripheral region and at least partially surrounds the display region, wherein the first crack detection line comprises a first lead segment, a second lead segment, a third lead segment, and a fourth lead segment, the first lead segment and the fourth lead segment are at least partially located in the bending region, the second lead segment and the third lead segment at least partially surround the display region, one end of the first lead segment is connected with one end of the second lead segment through a first via, the other end of the second lead segment is connected with one end of the third lead segment through a second via, and the other end of the third lead segment is connected with one end of the fourth lead segment;

the display substrate comprises a drive circuit layer located on the base substrate, a pixel definition layer and a light emitting structure layer which are located on a side of the drive circuit layer away from the base substrate, a touch structure layer located on a side of the pixel definition layer and the light emitting structure layer away from the base substrate, the pixel definition layer has a plurality of first openings in the display region, the plurality of first openings are configured to accommodate the light emitting structure layer;

the touch structure layer comprises a touch dielectric layer and a touch electrode layer located on a side of the touch dielectric layer away from the pixel definition layer;

the pixel definition layer has a first boundary on a side of the first via away from the display region, the touch dielectric layer has a second boundary on the side of the first via away from the display region, and the second boundary is located on a side of the first boundary away from the display region; and the pixel definition layer has a second opening in the peripheral region, and an orthographic projection of the first via on the base substrate is located in an orthographic projection of the second opening on the base substrate.

2. The display substrate according to claim 1, wherein a shortest distance between the first boundary and the second boundary is greater than 20 microns.

3. The display substrate according to claim 1, further comprising a first planarization layer located between the drive circuit layer and the pixel definition layer, the first planarization layer has a third boundary on a side away from the first via, and the second boundary is located on a side of the third boundary away from the display region.

4. The display substrate according to claim 3, wherein a shortest distance between the second boundary and the third boundary is greater than 20 microns.

5. The display substrate according to claim 3, wherein the second boundary is located in the bending region and the third boundary is located on a side of the first boundary close to the display region.

6. The display substrate according to claim 1, wherein a shortest distance between the first via and the second boundary and a shortest distance between the second via and the second boundary are equal.

7. The display substrate according to claim 1, further comprising a third via located on a side of the first via close to the display region, the third via electrically connects the second lead segment and the third lead segment.

8. The display substrate according to claim 7, wherein the touch dielectric layer covers the third via and at least part of the third lead segment.

9. The display substrate according to claim 1, wherein an orthographic projection of the second via on the base substrate is located in the orthographic projection of the second opening on the base substrate.

10. The display substrate according to claim 1, wherein the display substrate further comprises a plurality of pads located on a side of the bending region away from the display region;

the display substrate further comprises a test circuit, which is located between the bending region and the plurality of pads, and the other end of the first lead segment is electrically connected with the test circuit.

11. The display substrate according to claim 10, wherein the test circuit comprises a plurality of test units, at least one of the plurality of test units comprises a first transistor and a second transistor, control terminals of the first transistor and the second transistor are connected with a test control line, first ends of the first transistor and the second transistor are configured to be electrically connected with a data line, a second end of the first transistor is configured to be electrically connected with the first crack detection line, and a second end of the second transistor is configured to be electrically connected with a detection data line.

12. The display substrate according to claim 10, wherein the other end of the fourth lead segment is electrically connected with at least one of the plurality of pads.

13. The display substrate according to claim 10, further comprising a second crack detection line which is located in the peripheral region and at least partially surrounds the display region, the second crack detection line comprises a first end and a second end, the first end and the second end are respectively connected with at least one of the plurality of pads.

14. The display substrate according to claim 13, wherein the second crack detection line is left-right symmetrical with respect to a center line of the display region.

15. The display substrate according to claim 13, wherein the first crack detection line comprises a first sub-line and a second sub-line, and the second crack detection line comprises a third sub-line and a fourth sub-line, wherein the first sub-line is located in the peripheral region close to the third edge and the fourth edge, and the second sub-line is located in the peripheral region close to the second edge and the third edge;

the third sub-line is located in the peripheral region close to the third edge and the fourth edge, and the fourth sub-line is located in the peripheral region close to the second edge and the third edge.

16. The display substrate according to claim 1, wherein the display region comprises a first edge, a second edge, a third edge, and a fourth edge connected in sequence, and the first via is located in the peripheral region close to the first edge.

17. The display substrate according to claim 16, wherein the second lead segment is located in the peripheral region close to the first edge, the second edge, the third edge, and the fourth edge;

the third lead segment is located in the peripheral region close to the first edge, the second edge, the third edge, and the fourth edge; and the display region comprises a camera hole and the third lead segment is wound around the camera hole.

18. The display substrate according to claim 1, wherein the first via comprises two vias, the second via comprises two vias, the two first vias are left-right symmetrical with respect to a center line of the display region, and the two second vias are left-right symmetrical with respect to the center line of the display region;

or, the first via and the second via are located between the display region and the bending region.

19. The display substrate according to claim 1, wherein the drive circuit layer comprises an active layer, a first gate metal layer, a second gate metal layer, a first source drain metal layer, and a second source drain metal layer which are sequentially stacked on the base substrate, the first lead segment, the second lead segment, and the fourth lead segment are disposed in a same layer as any one or more of the first gate metal layer, the second gate metal layer, the first source drain metal layer, and the second source drain metal layer; and the third lead segment is disposed in a same layer as the touch electrode layer.

20. A display apparatus, comprising the display substrate according to claim 1.

\* \* \* \* \*